(12) United States Patent
Jain et al.

(10) Patent No.: US 12,327,773 B2
(45) Date of Patent: *Jun. 10, 2025

(54) PACKAGE WITH UNDERFILL CONTAINMENT BARRIER

(71) Applicant: Intel Corporation, Santa Clara, CA (US)

(72) Inventors: Rahul Jain, Gilbert, AZ (US); Kyu Oh Lee, Chandler, AZ (US); Siddharth K. Alur, Chandler, AZ (US); Wei-Lun K. Jen, Chandler, AZ (US); Vipul V. Mehta, Chandler, AZ (US); Ashish Dhall, Chandler, AZ (US); Sri Chaitra J. Chavali, Chandler, AZ (US); Rahul N. Manepalli, Chandler, AZ (US); Amruthavalli P. Alur, Tempe, AZ (US); Sai Vadlamani, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/415,268

(22) Filed: Jan. 17, 2024

(65) Prior Publication Data

US 2024/0186202 A1 Jun. 6, 2024

Related U.S. Application Data

(63) Continuation of application No. 18/133,868, filed on Apr. 12, 2023, now Pat. No. 11,935,805, which is a (Continued)

(51) Int. Cl.
*H01L 23/13* (2006.01)
*H01L 21/48* (2006.01)
(Continued)

(52) U.S. Cl.
CPC ...... *H01L 23/3185* (2013.01); *H01L 21/4853* (2013.01); *H01L 21/4857* (2013.01);
(Continued)

(58) Field of Classification Search
CPC ..... H01L 2224/16227; H01L 2924/181; H01L 24/81; H01L 24/16; H01L 23/49816;
(Continued)

(56) References Cited

U.S. PATENT DOCUMENTS

| 6,400,036 B1 | 6/2002 | Tang |
| 8,143,110 B2 * | 3/2012 | Karpur .................. H01L 21/563 438/118 |

(Continued)

FOREIGN PATENT DOCUMENTS

KR 20100129694 12/2010

OTHER PUBLICATIONS

International Search Report and Written Opinion for PCT Application No. PCT/US2016/69321 mailed Sep. 29, 2017, 16 pgs.

(Continued)

*Primary Examiner* — Alonzo Chambliss
(74) *Attorney, Agent, or Firm* — Schwabe, Williamson & Wyatt P.C.

(57) ABSTRACT

An apparatus is provided which comprises: a substrate, a die site on the substrate to couple with a die, a die side component site on the substrate to couple with a die side component, and a raised barrier on the substrate between the die and die side component sites to contain underfill material disposed at the die site, wherein the raised barrier comprises electroplated metal. Other embodiments are also disclosed and claimed.

20 Claims, 6 Drawing Sheets

Related U.S. Application Data continuation of application No. 17/459,993, filed on Aug. 27, 2021, now Pat. No. 11,664,290, which is a continuation of application No. 16/464,547, filed as application No. PCT/US2016/069321 on Dec. 29, 2016, now Pat. No. 11,158,558.

(51) Int. Cl.
| | | |
|---|---|---|
| *H01L 21/56* | (2006.01) | |
| *H01L 23/00* | (2006.01) | |
| *H01L 23/31* | (2006.01) | |
| *H01L 23/498* | (2006.01) | |
| *H01L 23/532* | (2006.01) | |
| *H01L 23/538* | (2006.01) | |
| *H01L 25/065* | (2023.01) | |

(52) U.S. Cl.
CPC ........ *H01L 21/563* (2013.01); *H01L 23/3128* (2013.01); *H01L 23/49816* (2013.01); *H01L 23/53295* (2013.01); *H01L 23/5381* (2013.01); *H01L 23/5383* (2013.01); *H01L 23/5386* (2013.01); *H01L 24/06* (2013.01); *H01L 24/13* (2013.01); *H01L 24/16* (2013.01); *H01L 24/81* (2013.01); *H01L 25/0655* (2013.01); *H01L 25/0657* (2013.01); *H01L 2224/16227* (2013.01); *H01L 2224/81* (2013.01); *H01L 2224/83051* (2013.01); *H01L 2924/18161* (2013.01)

(58) Field of Classification Search
CPC ............. H01L 21/4853; H01L 21/4857; H01L 21/563; H01L 25/0655; H01L 25/0657; H01L 23/3185; H01L 23/5381; H01L 23/5383; H01L 23/5386; H01L 23/3128; H01L 24/17; H01L 24/06; H01L 24/13
See application file for complete search history.

(56) References Cited

U.S. PATENT DOCUMENTS

| | | | |
|---|---|---|---|
| 8,399,300 B2 | 3/2013 | Lee | |
| 8,541,891 B2 | 9/2013 | Saeki | |
| 8,828,806 B2 | 9/2014 | Sumita | |
| 9,147,665 B2 | 9/2015 | Zhu | |
| 11,158,558 B2 | 10/2021 | Jain | |
| 11,664,290 B2 | 5/2023 | Jain | |
| 2002/0028533 A1 | 3/2002 | Tang | |
| 2002/0060084 A1 | 5/2002 | Hilton | |
| 2006/0226527 A1* | 10/2006 | Hatano | H01L 23/5389 438/109 |
| 2010/0007015 A1 | 1/2010 | Gallegos | |
| 2010/0304536 A1 | 12/2010 | Sumita | |
| 2011/0065421 A1* | 3/2011 | Gluck | G06Q 30/02 455/414.1 |
| 2011/0095421 A1 | 4/2011 | Kim | |
| 2011/0147912 A1 | 6/2011 | Karpur | |
| 2011/0275177 A1* | 11/2011 | Yim | H01L 25/0657 257/E21.505 |
| 2012/0049332 A1* | 3/2012 | Chen | H01L 25/0657 257/632 |
| 2013/0256000 A1 | 10/2013 | Terui | |
| 2014/0061902 A1 | 3/2014 | Ramalingam | |
| 2014/0332966 A1* | 11/2014 | Xiu | H01L 23/293 257/773 |
| 2017/0103906 A1 | 4/2017 | Han | |
| 2017/0287735 A1* | 10/2017 | Yao | H01L 21/565 |

OTHER PUBLICATIONS

International Preliminary Report on Patentability for PCT/US2016/69321, mailed Jul. 11, 2019, 13 pgs.

* cited by examiner

PACKAGE WITH UNDERFILL CONTAINMENT BARRIER

CLAIM OF PRIORITY

This application is a continuation of U.S. patent application Ser. No. 18/133,868, filed Apr. 12, 2023, which is a continuation of U.S. patent application Ser. No. 17/459,993, filed Aug. 27, 2021, now U.S. Pat. No. 11,664,290, issued May 30, 2023, which is a continuation of U.S. patent application Ser. No. 16/464,547, filed May 28, 2019, now U.S. Pat. No. 11,158,558, issued Oct. 26, 2021, and titled "PACKAGE WITH UNDERFILL CONTAINMENT BARRIER", which is a National Stage Entry of, and claims priority to, PCT Application No. PCT/US2016/069321, filed on Dec. 29, 2016 and titled "PACKAGE WITH UNDERFILL CONTAINMENT BARRIER", which is incorporated by reference in their entirety for all purposes.

BACKGROUND

In most cases where an integrated circuit die is attached to a package substrate, an electrically-insulating adhesive is "underfilled" in the small space between the chip's circuitry and the underlying mounting to provide a stronger mechanical connection, provide a heat bridge, and to ensure the solder joints are not stressed due to differential heating of the chip and the rest of the system. The underfill distributes the thermal expansion mismatch between the chip and the board, preventing stress concentration in the solder joints which would lead to premature failure. Since the underfill is generally a liquid when applied, it has the tendency to flow across the surface of the substrate away from the die site. For this reason, keep out zones (KOZ) where no die side components (DSC) are sited may be necessary. KOZs, however, tend to lead to undesirable increases in substrate size in order to accommodate necessary DSCs.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
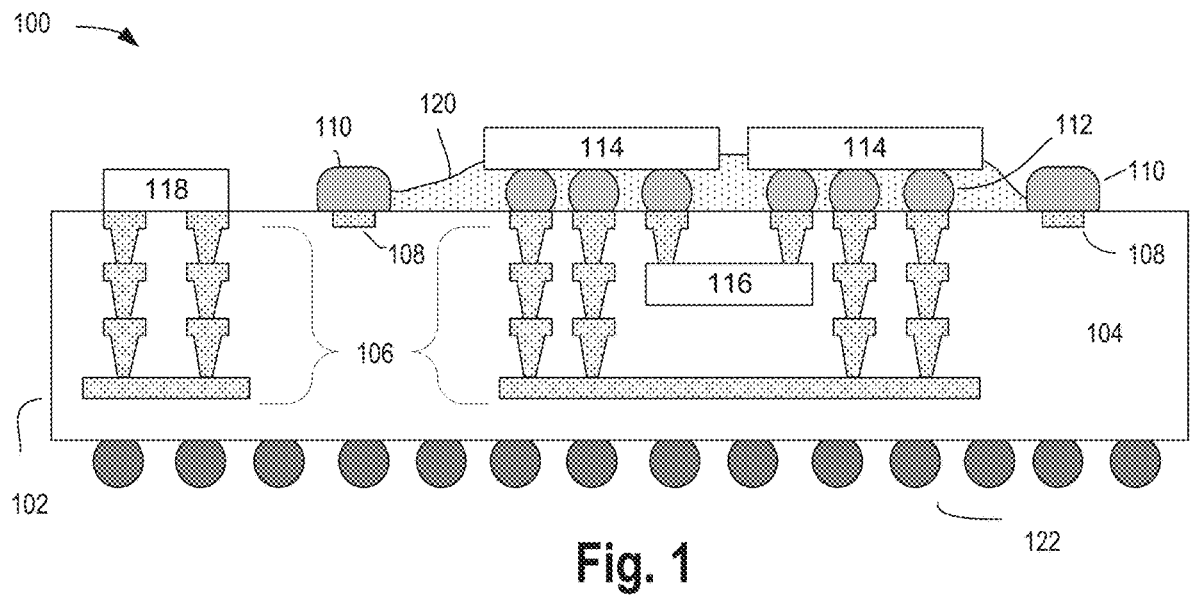
FIG. 1 illustrates a cross-sectional view of a package with an underfill containment barrier, according to some embodiments.

Packages with underfill containment barriers are generally presented. In this regard, embodiments of the present invention enable raised metal barriers surrounding die sites. One skilled in the art would appreciate that these raised barriers may enable reductions in keep out zones, thereby conserving package space, by containing underfill closer to die sites. Additionally, in some embodiments, these raised barriers may allow a reduction of the plated copper thickness on the edge bumps of integrated circuit die sites, making the overall copper thickness in the bump field more uniform.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C). The terms "left," "right," "front," "back," "top," "bottom," "over," "under," and the like in the description and in the claims, if any, are used for descriptive purposes and not necessarily for describing permanent relative positions.

FIG. 1 illustrates a cross-sectional view of a package with wall-side capacitors, according to some embodiments. As shown, package 100 includes substrate 102, dielectric layers 104, interconnects 106, surface anchors 108, underfill containment barrier 110, bumps 112, integrated circuit dies 114, embedded interconnect bridge 116, die side component 118, underfill 120, and package contacts 122.

Substrate 102 may include any number of dielectric layers 104 and interconnects 106. In some embodiments, dielectric layers 104 may include organic materials, epoxies, or other materials that are electrical insulators for interconnect 106.

Interconnects 106 may include conductive planes, traces, and vias, for example of copper, to conductively couple contacts on a first surface of substrate 102, for example bumps 112, with contacts on a second surface of substrate 102, for example package contacts 122. Surface anchors 108 may be included in or on a surface of substrate 102 to anchor underfill containment barrier 110. In some embodiments, surface anchors 108 are plated surface routing openings as shown in more detail hereinafter.

Underfill containment barrier 110 may be a raised barrier that at least partially surrounds integrated circuit die sites in order to serve as a dam to hold back underfill material. In some embodiments, the underfill containment barrier 110 may be able to contain underfill closer to the die sites thereby reducing keep out zones and allowing die side components to be sited closer to the die sites. In some embodiments, underfill containment barrier 110 is formed from metal electroplating, for example with copper or other metals, as described in more detail hereinafter. While shown as including straight sides with rounded corners, underfill containment barrier 110 may have curved sides or straight corners or various other shapes. In some embodiments, underfill containment may have a height of about 18 um and a width of between about 45 um and 200 um.

In some embodiments, underfill containment barrier 110 is formed simultaneously with bumps 112, which may represent C4 bumps for coupling with integrated circuit dies 114. While shown as including two integrated circuit dies 114, embodiments of the present invention may include just one integrated circuit die or eight or more integrated circuit dies. In some embodiments, integrated circuit dies 114 may include a processor and a field programmable gate array (FPGA), although other devices, including controllers or memory devices, may be included. In some embodiments, integrated circuit dies 114 may include an interfacing communication path through embedded interconnect bridge 116, which may be embedded in a dielectric layer 104 of substrate 102.

Die side component 118 may represent any type of die side component, including, but not limited to, capacitors, resistors, inductors, memory, or other circuits or circuit components. In some embodiments, die side components 118 can only be located outside of a keep out zone which may be to account for underfill 120. In some embodiments, underfill 120 may be capillary underfill that would flow beyond underfill containment barrier 110 if the latter weren't present.

Package contacts 122 may allow package 100 to be coupled with other devices, sockets, systems, etc. In some embodiments, package contacts 122 may represent solder balls, or lands, or pins.

Figure 2A:
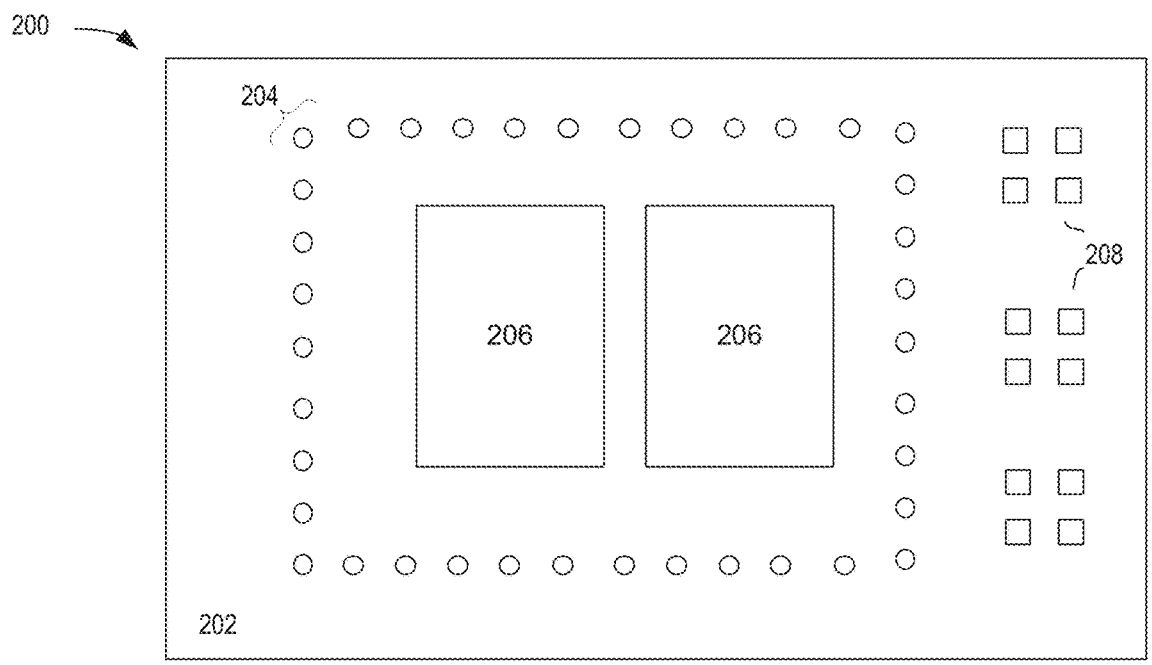
FIGS. 2A-2G illustrate overhead views of manufacturing steps of an underfill containment barrier, according to some embodiments.

FIGS. 2A-2G illustrate overhead views of manufacturing steps of an underfill containment barrier, according to some embodiments. As shown in FIG. 2A, assembly 200 includes substrate 202, anchor sites 204, die sites 206, and die side component sites 208. Openings may have been created on a surface, in some embodiments on a top solder resist layer, of substrate 202 to form anchor sites 204, die sites 206, and die side component sites 208. In some embodiments, conventional surface routing patterning techniques are utilized to create the surface routing openings.

Figure 2B:
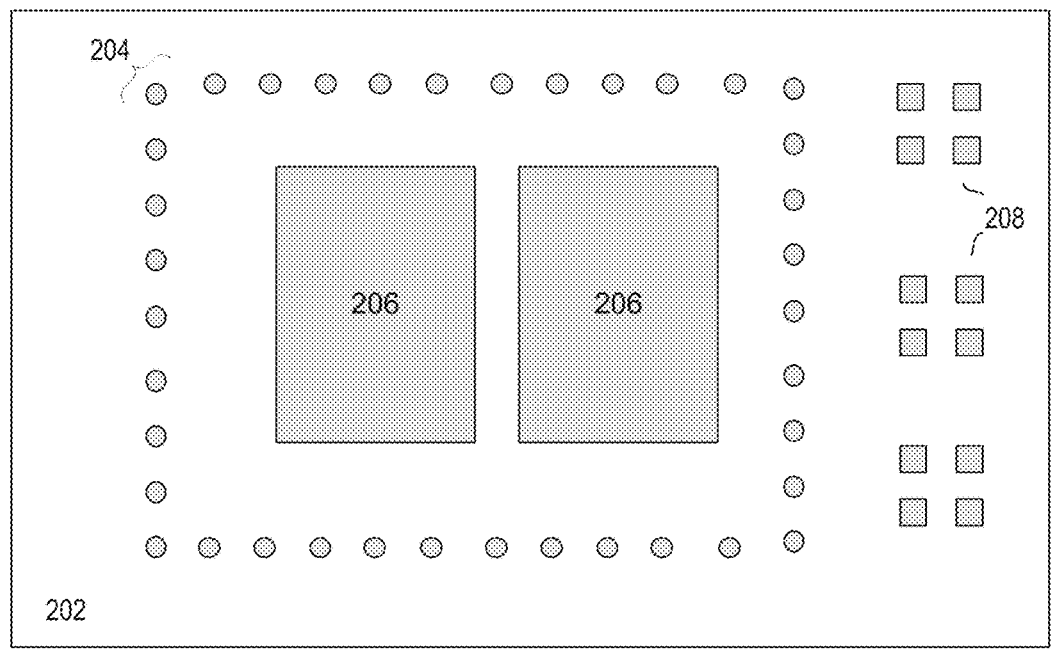

FIG. 2B shows assembly 210, which may have had the openings of anchor sites 204, die sites 206, and die side component sites 208 filled with conductive material. In some embodiments, anchor sites 204, die sites 206, and die side component sites 208 are filled with a lead-free diffusion barrier between copper and solder, such as NiPdAu.

Figure 2C:
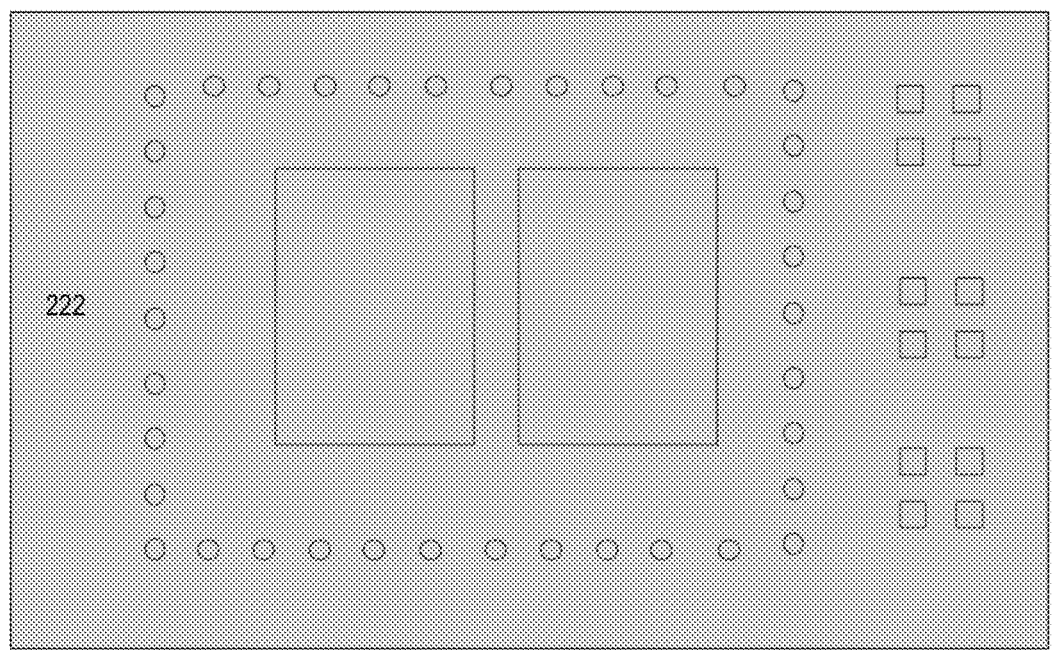

As shown in FIG. 2C, assembly 220 has had copper seed layer 222 deposited or plated over the substrate surface covering anchor sites 204, die sites 206, and die side component sites 208. In some embodiments, copper seed layer 222 is a thin film produced by chemical vapor deposition (CVD).

Figure 2D:
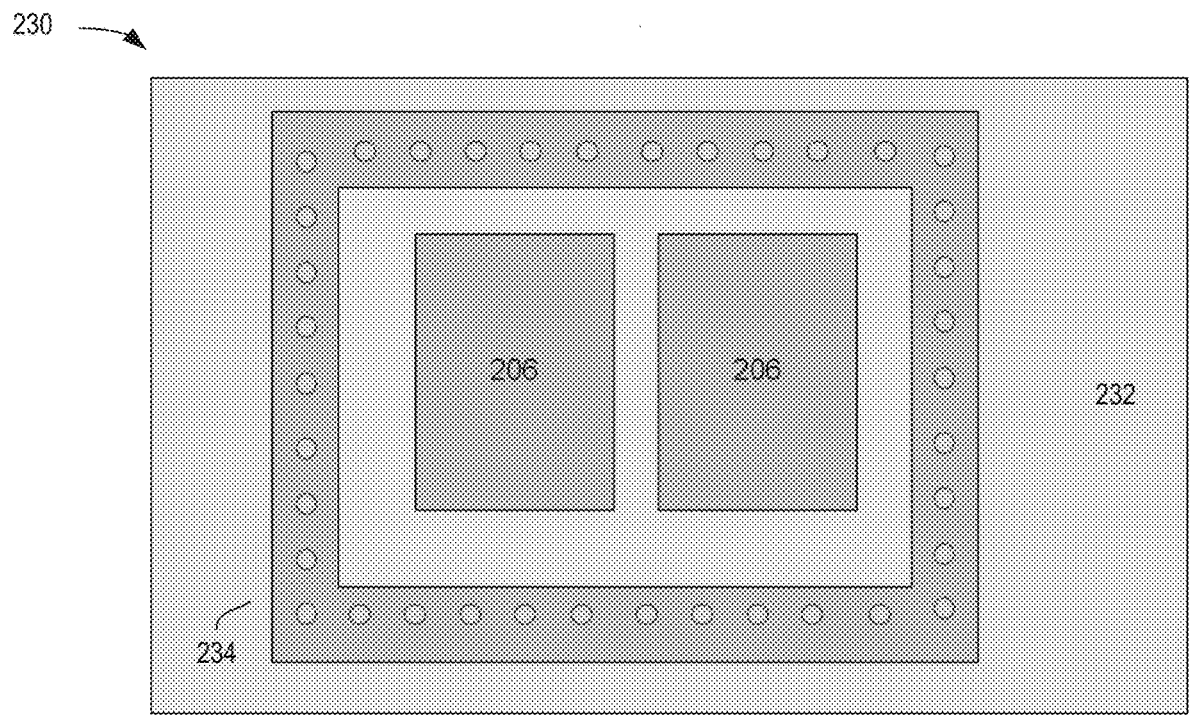

Turning now to FIG. 2D, assembly 230 may include film 232 that has been deposited over the substrate surface covering copper seed layer 222. In some embodiments, pattern openings have been created in film 232 to expose portions of copper seed layer 222 where copper is to be electroplated. In some embodiments, openings in film 232 are created for containment barrier 234 and die sites 206.

Figure 2E:
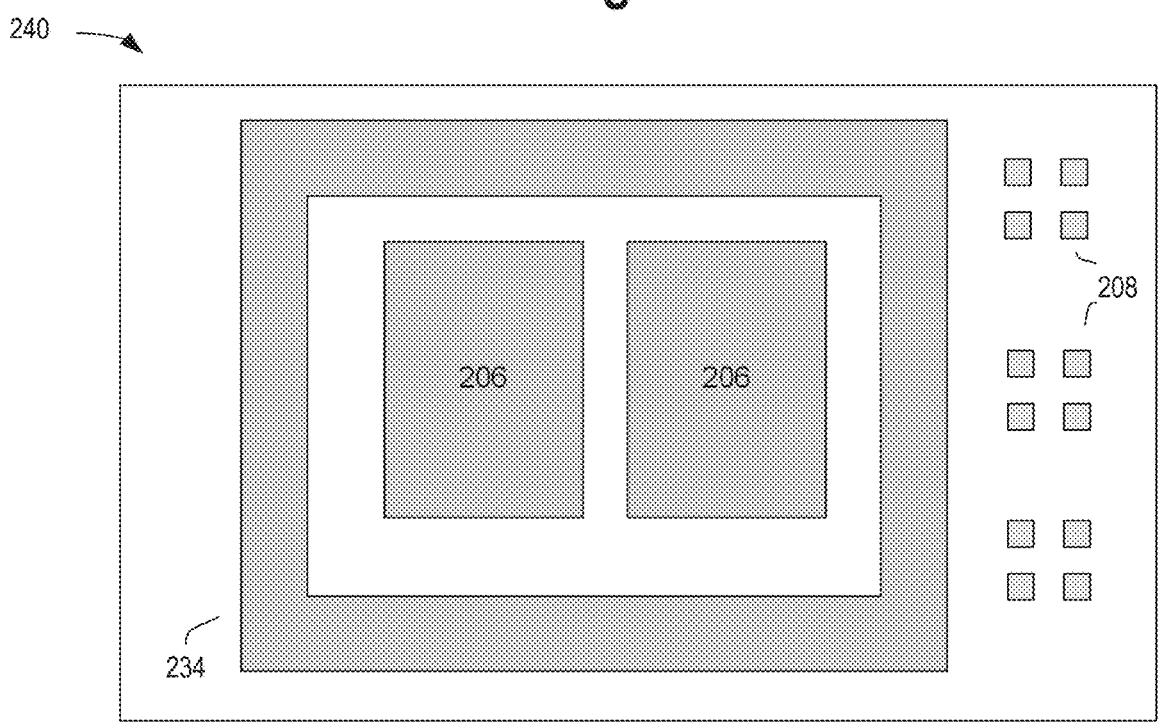

FIG. 2E shows assembly 240, which may have had copper, or other metal, plated to form containment barrier 234 and bumps of die sites 206. In some embodiments, film 232 and copper seed layer 222 have been removed by chemical or mechanical methods to expose the substrate surface including die side component sites 208. While shown as being a rectangular shape, containment barrier 234 may be other shapes including straight or curved line segments.

Figure 2F:
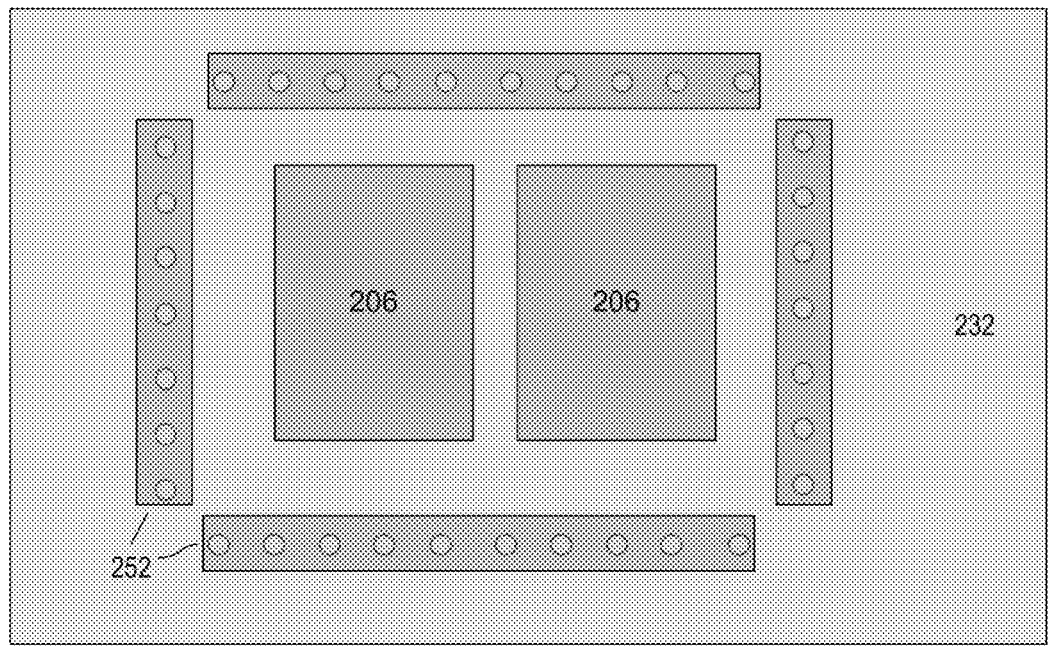

As shown in FIG. 2F, assembly 250 may include an alternative pattern for film 232 than assembly 230. In some embodiments, containment barrier segments 252 may be patterned in film 232 to include gaps. While shown as being discontinuous segments with gaps in the corners of a rectangle, containment barrier segments 252 may have irregular gaps and containment barrier segments 252 may form any shape.

Figure 2G:
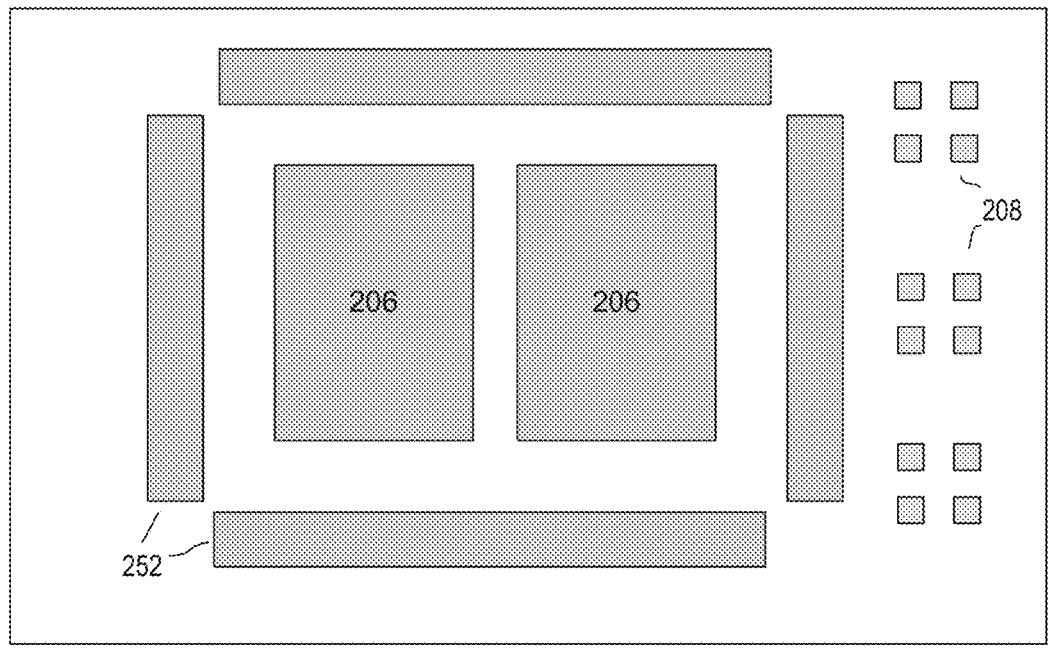

Turning now to FIG. 2G, as an alternative to assembly 240, assembly 260 may include metal plated containment barrier segments 252 forming a discontinuous containment barrier with gaps. In some embodiments, gaps between containment barrier segments 252 are sufficiently narrow that, perhaps based on the viscosity of the underfill material to be used, the ability of containment barrier segments 252 to contain underfill is not substantially compromised.

Figure 3:
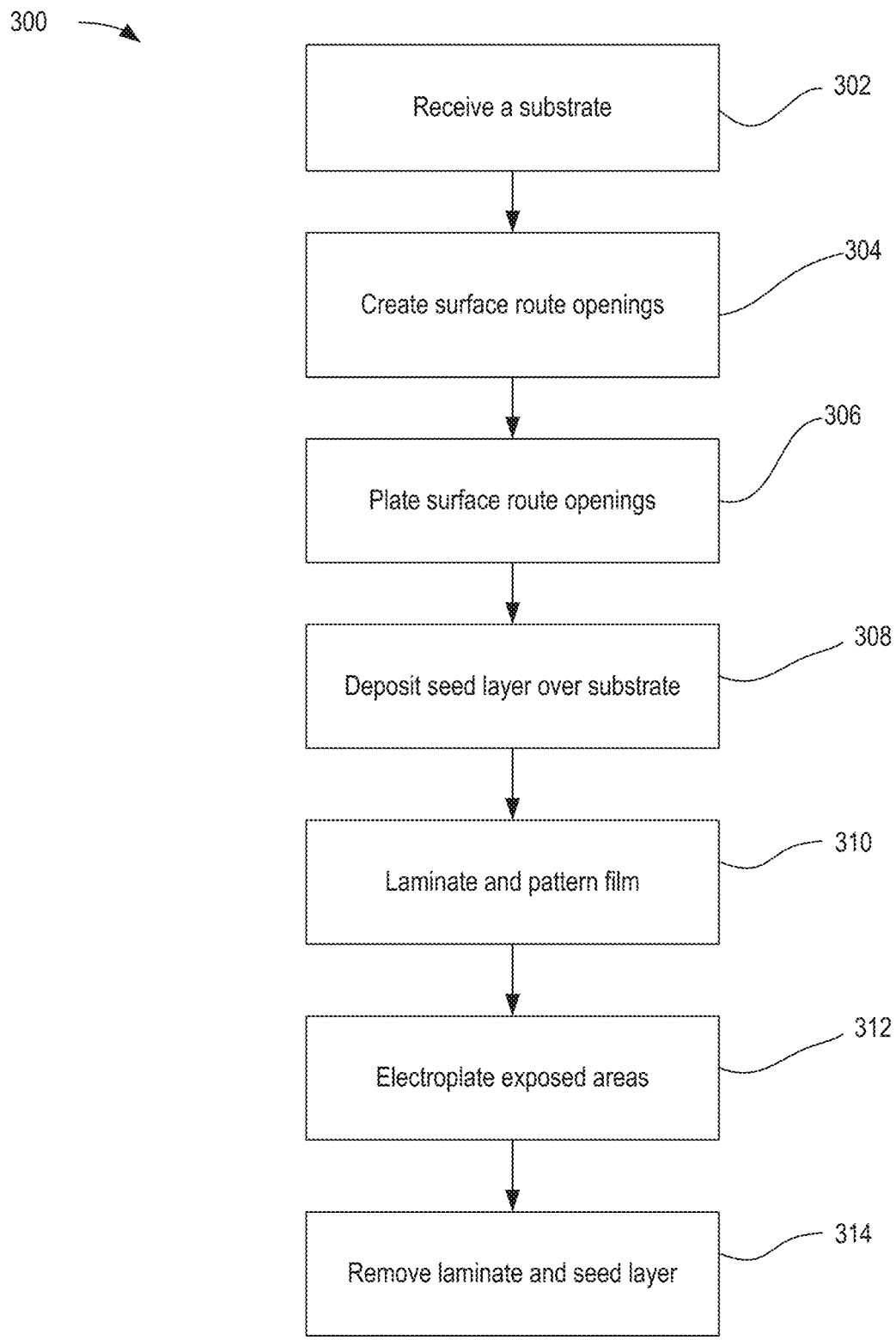
FIG. 3 illustrates a flowchart of a method of forming a package with an underfill containment barrier, in accordance with some embodiments.

FIG. 3 illustrates a flowchart of a method of forming a package with an underfill containment barrier, in accordance with some embodiments. Although the blocks in the flowchart with reference to FIG. 3 are shown in a particular order, the order of the actions can be modified. Thus, the illustrated embodiments can be performed in a different order, and some actions/blocks may be performed in parallel. Some of the blocks and/or operations listed in FIG. 3 are optional in accordance with certain embodiments. The numbering of the blocks presented is for the sake of clarity and is not intended to prescribe an order of operations in which the various blocks must occur. Additionally, operations from the various flows may be utilized in a variety of combinations.

Method 300 begins with receiving (302) a substrate, such as substrate 202. Next, surface routing openings are created (304) on a surface of substrate 202. In some embodiments, surface routing openings are created for anchor sites 204, die sites 206, and die side component sites 208.

Then, surface routing openings are plated (306). In some embodiments, a combination of metals, such as nickel, palladium, and gold, are used to fill the openings of anchor sites 204, die sites 206, and die side component sites 208. Next, in some embodiments, a copper seed layer 222 is deposited (308) or plated over the substrate surface, covering anchor sites 204, die sites 206, and die side component sites 208.

The method continues with laminating and patterning (310) film 232. In some embodiments, the patterning of film 232 can produce a continuous containment barrier 234. In some embodiments, the patterning of film 232 can produce discontinuous containment barrier segments 252. Next, exposed areas are electroplated (312), for example to form underfill containment barrier 110 and bumps 112. Finally, the laminate (film 232) and copper seed layer 222 are removed (314) to expose the substrate surface including die side component sites 208.

Figure 4:
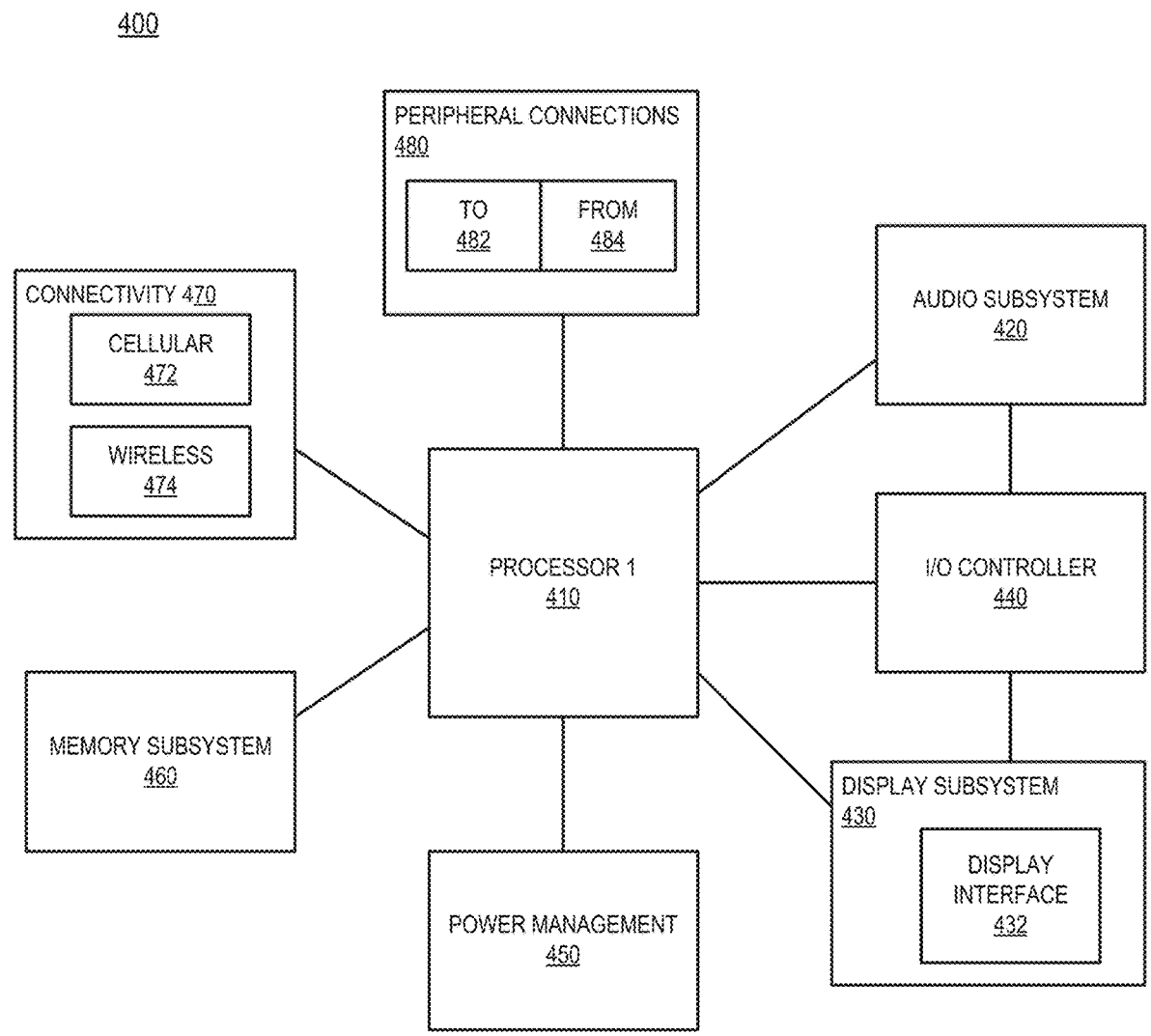
FIG. 4 illustrates a smart device or a computer system or a SoC (System-on-Chip) which includes a package with an underfill containment barrier, according to some embodiments.

FIG. 4 illustrates a smart device or a computer system or a SoC (System-on-Chip) 400 which includes a package with an underfill containment barrier, according to some embodiments. In some embodiments, computing device 400 represents a mobile computing device, such as a computing tablet, a mobile phone or smart-phone, a wireless-enabled e-reader, or other wireless mobile device. It will be understood that certain components are shown generally, and not all components of such a device are shown in computing device 400. In some embodiments, one or more components of computing device 400, for example processor 410 and/or memory subsystem 460, are included in a package with an underfill containment barrier as described above.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors-BJT PNP/NPN, BiCMOS, CMOS, etc., may be used without departing from the scope of the disclosure.

In some embodiments, computing device 400 includes a first processor 410. The various embodiments of the present disclosure may also comprise a network interface within 470 such as a wireless interface so that a system embodiment may be incorporated into a wireless device, for example, cell phone or personal digital assistant.

In one embodiment, processor 410 can include one or more physical devices, such as microprocessors, application processors, microcontrollers, programmable logic devices, or other processing means. The processing operations performed by processor 410 include the execution of an operating platform or operating system on which applications and/or device functions are executed. The processing operations include operations related to I/O (input/output) with a human user or with other devices, operations related to power management, and/or operations related to connecting the computing device 400 to another device. The processing operations may also include operations related to audio I/O and/or display I/O.

In one embodiment, computing device 400 includes audio subsystem 420, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 400, or connected to the computing device 400. In one embodiment, a user interacts with the computing device 400 by providing audio commands that are received and processed by processor 410.

Display subsystem 430 represents hardware (e.g., display devices) and software (e.g., drivers) components that provide a visual and/or tactile display for a user to interact with the computing device 400. Display subsystem 430 includes display interface 432, which includes the particular screen or hardware device used to provide a display to a user. In one embodiment, display interface 432 includes logic separate from processor 410 to perform at least some processing related to the display. In one embodiment, display subsystem 430 includes a touch screen (or touch pad) device that provides both output and input to a user.

I/O controller 440 represents hardware devices and software components related to interaction with a user. I/O controller 440 is operable to manage hardware that is part of audio subsystem 420 and/or display subsystem 430. Additionally, I/O controller 440 illustrates a connection point for additional devices that connect to computing device 400 through which a user might interact with the system. For example, devices that can be attached to the computing device 400 might include microphone devices, speaker or stereo systems, video systems or other display devices, keyboard or keypad devices, or other I/O devices for use with specific applications such as card readers or other devices.

As mentioned above, I/O controller 440 can interact with audio subsystem 420 and/or display subsystem 430. For example, input through a microphone or other audio device can provide input or commands for one or more applications or functions of the computing device 400. Additionally, audio output can be provided instead of, or in addition to display output. In another example, if display subsystem 430 includes a touch screen, the display device also acts as an input device, which can be at least partially managed by I/O controller 440. There can also be additional buttons or switches on the computing device 400 to provide I/O functions managed by I/O controller 440.

In one embodiment, I/O controller 440 manages devices such as accelerometers, cameras, light sensors or other environmental sensors, or other hardware that can be included in the computing device 400. The input can be part of direct user interaction, as well as providing environmental input to the system to influence its operations (such as filtering for noise, adjusting displays for brightness detection, applying a flash for a camera, or other features).

In one embodiment, computing device 400 includes power management 450 that manages battery power usage, charging of the battery, and features related to power saving operation. Memory subsystem 460 includes memory devices for storing information in computing device 400. Memory can include nonvolatile (state does not change if power to the memory device is interrupted) and/or volatile (state is indeterminate if power to the memory device is interrupted) memory devices. Memory subsystem 460 can store application data, user data, music, photos, documents, or other data, as well as system data (whether long-term or temporary) related to the execution of the applications and functions of the computing device 400.

Elements of embodiments are also provided as a machine-readable medium (e.g., memory 460) for storing the computer-executable instructions. The machine-readable medium (e.g., memory 460) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 470 includes hardware devices (e.g., wireless and/or wired connectors and communication hardware) and software components (e.g., drivers, protocol stacks) to enable the computing device 400 to communicate with external devices. The computing device 400 could be separate devices, such as other computing devices, wireless access points or base stations, as well as peripherals such as headsets, printers, or other devices.

Connectivity 470 can include multiple different types of connectivity. To generalize, the computing device 400 is illustrated with cellular connectivity 472 and wireless connectivity 474. Cellular connectivity 472 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 474 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 480 include hardware interfaces and connectors, as well as software components (e.g., drivers, protocol stacks) to make peripheral connections. It will be understood that the computing device 400 could both be a peripheral device ("to" 482) to other computing devices, as well as have peripheral devices ("from" 484) connected to it. The computing device 400 commonly has a "docking" connector to connect to other computing devices for purposes such as managing (e.g., downloading and/or uploading, changing, synchronizing) content on computing device 400. Additionally, a docking connector can allow computing device 400 to connect to certain peripherals that allow the computing device 400 to control content output, for example, to audiovisual or other systems.

In addition to a proprietary docking connector or other proprietary connection hardware, the computing device 400 can make peripheral connections 480 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

In one example, an apparatus is provided comprising: a substrate; a die site on the substrate to couple with a die; a die side component site on the substrate to couple with a die side component; and a raised barrier on the substrate between the die site and the die side component site to contain underfill material disposed at the die site, wherein the raised barrier comprises electroplated metal.

Some embodiments also include a second die site on the substrate adjacent the first die site. Some embodiments also include an embedded interconnect bridge (EMIB) in the substrate communicatively coupling the first and second die sites. In some embodiments, the raised barrier comprises discontinuous segments. In some embodiments, the raised barrier comprises a height of about 18 um. In some embodiments, the raised barrier comprises a width of between about 45 um and 200 um.

In another example, an apparatus is provided comprising: one or more integrated circuit die(s); and a substrate, wherein the substrate comprises: a plurality of dielectric layers; one or more integrated circuit die site(s); one or more die side component site(s); and a raised metal barrier between the integrated circuit die site(s) and die side component site(s) to contain underfill material disposed at the integrated circuit die site(s), wherein the raised metal barrier comprises electroplated copper.

In some embodiments, the raised metal barrier comprises discontinuous segments. In some embodiments, the discontinuous segments form a rectangle. In some embodiments, the raised metal barrier further comprises anchors within a dielectric layer. Some embodiments also include an embedded interconnect bridge (EMIB) in the dielectric layers communicatively coupling adjacent integrated circuit die sites. In some embodiments, the raised metal barrier further comprises a height of about 18 um and a width of between about 45 um and 200 um.

In another example, a system is provided comprising: a display subsystem; a wireless communication interface; and an integrated circuit package, the integrated circuit package comprising: one or more integrated circuit die(s); and a substrate coupled with the die(s), wherein the substrate comprises: a plurality of dielectric layers; a plurality of integrated circuit die site(s); a plurality of die side components site(s); and a raised metal barrier surrounding the integrated circuit die sites, the raised metal barrier between the integrated circuit die and die side component sites to contain underfill material disposed at the integrated circuit die site(s), wherein the raised metal barrier comprises electroplated copper.

In some embodiments, the raised metal barrier comprises discontinuous segments. In some embodiments, the discontinuous segments comprise gaps at corners of a rectangle. In some embodiments, the raised metal barrier further comprises anchors within a dielectric layer. Some embodiments also include an embedded interconnect bridge (EMIB) in the dielectric layers communicatively coupling adjacent integrated circuit die sites. In some embodiments, the raised metal barrier further comprises a height of about 18 um and a width of between about 45 um and 200 um.

In another example, a method is provided comprising: forming a substrate; forming one or more die site(s) on the substrate; forming one or more die side component site(s) on the substrate; and forming a raised metal barrier between the integrated circuit die and die side component sites to contain underfill material disposed at the integrated circuit die site(s), wherein the raised metal barrier comprises electroplated copper.

In some embodiments, forming the raised metal barrier comprises: forming a metal barrier width of between about 45 um and 200 um; and forming a metal barrier height of about 18 um. In some embodiments, forming the metal barrier comprises: creating a plurality of surface routing openings on the substrate; plating the surface routing openings to form anchors; and electroplating over the anchors with copper. In some embodiments, forming the substrate comprises embedding an interconnect bridge below a substrate surface to communicatively couple two adjacent die sites. In some embodiments, forming the raised metal barrier comprises forming discontinuous segments. In some embodiments, forming discontinuous segments comprises forming segments with gaps at angular intersection of segments. Some embodiments also include: attaching one or more die(s) to the site(s); and adding underfill material under the one or more die(s).

In another example, an integrated circuit device package with an underfill containment barrier is provided comprising: a substrate; a die site on the substrate to couple with a die; a die side component site on the substrate to couple with a die side component; and a barrier means on the substrate between the die and die side component sites to contain underfill material disposed at the die site, wherein the raised barrier comprises electroplated metal.

Some embodiments also include a second die site on the substrate adjacent the first die site. Some embodiments also include an embedded interconnect bridge (EMIB) in the substrate communicatively coupling the first and second die sites. In some embodiments, the raised barrier comprises discontinuous segments. In some embodiments, the raised barrier comprises a height of about 18 um. In some embodiments, the raised barrier comprises a width of between about 45 um and 200 um.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
   a substrate;
   a first die and a second die over a surface of the substrate, the second die laterally spaced apart from the first die;
   an interconnect bridge coupled to the substrate, the interconnect bridge beneath the first die and the second die, the interconnect bridge partially within a footprint of the first die and partially within a footprint of the second die, and the interconnect bridge coupled to the first die and the second die;
   a metal structure on the surface of the substrate, the metal structure extending away from the surface of the substrate, and the metal structure laterally surrounding the first die and the second die; and
   a dielectric material laterally between the metal structure and the first die or the second die, wherein the dielectric material does not extend beyond the metal structure.

2. The apparatus of claim 1, wherein the interconnect bridge is in the substrate.

3. The apparatus of claim 1, wherein the metal structure includes at least one anchor extending into the surface of the substrate.

4. The apparatus of claim 3, wherein a continuous portion of the metal structure on the surface of the substrate is coupled to two or more anchors extending into the surface of the substrate.

5. The apparatus of claim 1, wherein the metal structure comprises discontinuous segments.

6. The apparatus of claim 5, wherein the discontinuous segments form a rectangle.

7. The apparatus of claim 1, wherein the metal structure is continuous around the first die and the second die.

8. The apparatus of claim 1, wherein the interconnect bridge communicatively couples the first die and the second die.

9. The apparatus of claim 1, further comprising:
   a die side component on the surface of the substrate, the die side component outside of the metal structure.

10. The apparatus of claim 1, wherein the dielectric material is in contact with both the first die and the second die.

11. The apparatus of claim 10, wherein the dielectric material is laterally between the first die and the second die.

12. A system, comprising:
   a display subsystem;
   a wireless communication interface; and
   an integrated circuit package, the integrated circuit package comprising:
      a substrate;
      a first die and a second die over a surface of the substrate, the second die laterally spaced apart from the first die;
      an interconnect bridge coupled to the substrate, the interconnect bridge beneath the first die and the second die, the interconnect bridge partially within a footprint of the first die and partially within a footprint of the second die, and the interconnect bridge coupled to the first die and the second die;

a metal structure on the surface of the substrate, the metal structure extending away from the surface of the substrate, and the metal structure laterally surrounding the first die and the second die; and a dielectric material laterally between the metal structure and the first die or the second die, wherein the dielectric material does not extend beyond the metal structure.

13. The apparatus of claim 12, wherein the interconnect bridge is in the substrate.

14. The system of claim 12, wherein the metal structure includes at least one anchor extending into the surface of the substrate.

15. The system of claim 14, wherein a continuous portion of the metal structure on the surface of the substrate is coupled to two or more anchors extending into the surface of the substrate.

16. The system of claim 12, wherein the metal structure comprises discontinuous segments.

17. The system of claim 16, wherein the discontinuous segments form a rectangle.

18. The system of claim 12, wherein the metal structure is continuous around the first die and the second die.

19. The system of claim 12, wherein the interconnect bridge communicatively couples the first die and the second die.

20. The apparatus of claim 12, further comprising:

a die side component on the surface of the substrate, the die side component outside of the metal structure.

* * * * *